United States Patent
Kashiwazaki

(10) Patent No.: US 6,819,618 B2
(45) Date of Patent: Nov. 16, 2004

(54) SEMICONDUCTOR MEMORY DEVICE CAPABLE OF EXECUTING REFRESH OPERATION ACCORDING TO REFRESH SPACE

(75) Inventor: Yasuhiro Kashiwazaki, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/697,097

(22) Filed: Oct. 31, 2003

(65) Prior Publication Data

US 2004/0165465 A1 Aug. 26, 2004

(30) Foreign Application Priority Data

Feb. 25, 2003 (JP) ........................................ 2003-047167

(51) Int. Cl.[7] ................................................. G11C 7/20
(52) U.S. Cl. .................. 365/222; 365/230.03; 365/240; 365/236; 365/233
(58) Field of Search ............................ 365/222, 230.03, 365/240, 239, 236, 233

(56) References Cited

U.S. PATENT DOCUMENTS 4,701,843 A * 10/1987 Cohen ........................ 711/105

2001/0045579 A1 11/2001 Ooishi et al. ............... 257/222

FOREIGN PATENT DOCUMENTS

| JP | 60-175294 | 9/1985 | ........... G11C/11/34 |
| JP | 3-66092 | 3/1991 | ......... G11C/11/406 |
| JP | 2001-338489 | 12/2001 | ......... G11C/11/403 |

* cited by examiner

Primary Examiner—Andrew Q. Tran
(74) Attorney, Agent, or Firm—McDermott Will & Emery LLP

(57) ABSTRACT

A semiconductor memory device includes a memory having a predetermined number of divided memory spaces, a register that stores data indicating whether a refresh operation is required or not with respect to each memory space, a row address counter that, with reference to the register, counts up an address while skipping an address requiring no refresh operation, to thereby generate an address of the memory space to be refreshed, and a refresh cycle generating circuit that with reference to the register 15, generates a refresh cycle with a cycle which varies according to the number of the memory space requiring the refresh operation.

3 Claims, 5 Drawing Sheets

SEMICONDUCTOR MEMORY DEVICE CAPABLE OF EXECUTING REFRESH OPERATION ACCORDING TO REFRESH SPACE

BACKGROUND OF THE INVENTION

1. Field of the Invention

The present invention relates to a semiconductor memory device, and more particularly to a semiconductor memory device executing a self-refresh operation.

2. Related Art

A semiconductor memory device (DRAM) has recently been used for a portable data terminal. The portable data terminal is supplied with power from a battery, and thus it is required for reducing power consumption to attain a continuous long-term use.

A conventional DRAM, when in a self-refresh mode, forcibly executes the refresh operation for all row addresses including memory cells to which data has not been written, thereby bringing a flow of unnecessary self-refresh current (Icc6).

To solve this problem, in a DRAM having low power consumption and recently beginning to appear on the market, a memory space to which the self-refresh operation can be conducted can be designated by setting a mode register to thereby perform a partial self-refresh operation. Thus the unnecessary self-refresh current (Icc6) can be reduced.

Further, there has been proposed the one in which an internal register stores a start address and end address of a space to which the refresh operation is required to be executed, and then, the refresh operation is executed only to the stored addresses, and further, the cycle is made variable according to the size of the space to which the refresh operation is required to be executed, to thereby reduce the refresh current (Icc6) (for example, refer to Reference 1). Moreover, Reference 2 and Reference 3 disclose a technique concerning a control of the refresh operation in a semiconductor memory device.

However, in a DRAM with low power consumption, a mode register is required to be set externally or form outside in order to execute a partial self-refresh operation, resulting in a troublesome processing.

Further, Reference 1, information of the start address and end address is only stored in the internal register with respect to the space requiring no refresh operation. Accordingly, in case that the address of the space requiring no refresh operation is discontinuous, there arises a problem, for example, that the current reduction effect is small.

<References>

Reference 1: Japanese Laid-Open Patent Publication No. 2001-338489.

Reference 2: Japanese Laid-Open Patent Publication No. 60-175294.

Reference 3: Japanese Laid-Open Patent Publication No. 3-66092.

SUMMARY OF THE INVENTION

The present invention is directed to solve the above-mentioned problem, and aims to provide a semiconductor memory device that automatically executes a partial refresh operation without requiring an external setting with a mode register or the like, thereby reducing self-refresh current.

A semiconductor memory device according to the invention includes a memory, a register, an address counter and a cycle generating circuit. The memory requires a refresh operation and has a predetermined number of divided memory spaces. The register stores information indicating whether the refresh operation is required or not with respect to each memory space. The address counter, with reference to the register, counts up an address while skipping an address for the memory space requiring no refresh operation to generate an address of the memory space to be refreshed. The cycle generating circuit, with reference to the register, generates a refresh cycle of which cycle varies according to the number of the memory spaces requiring the refresh.

The semiconductor memory device according to the present invention performs the self-refresh operation only to the memory space requiring the self-refresh operation, thereby being capable of reducing the self-refresh current (Icc6).

DESCRIPTION OF THE PREFERRED EMBODIMENT

Preferred embodiments of a semiconductor memory device according to the present invention will be explained in detail with reference to the accompanying drawings.

First Embodiment

Figure 1:
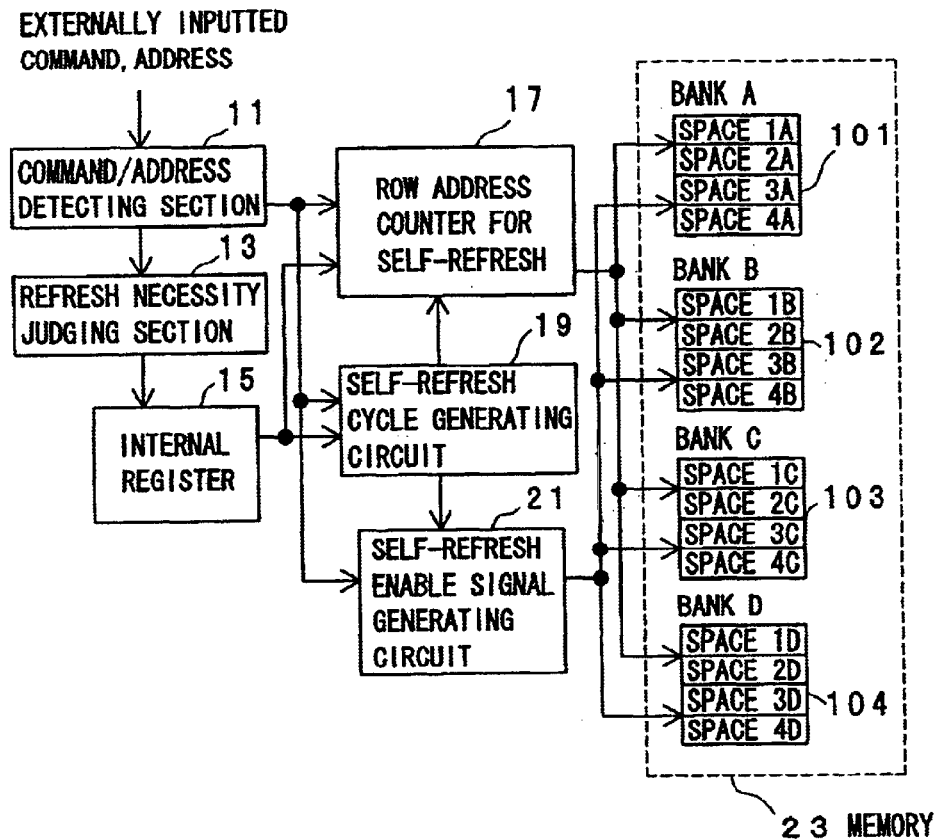
FIG. 1 is a view showing a configuration of a semiconductor memory device according to the present invention (First Embodiment).

FIG. 1 shows a configuration of the semiconductor memory device according to the present invention. The semiconductor memory device has a command/address detecting section 11, a refresh necessity judging section 13, an internal register 15, a row address counter for self-refresh 17, a self-refresh cycle generating circuit 19, a self-refresh enable signal generating circuit 21 and a memory 23.

In the present embodiment, a memory space of the memory 23 is divided into spaces 101 to 104 composed of banks A to D which are classified by bank addresses BA[1] and BA[0]. The bank A is a space of BA[1]=0 and BA[0]=0, the bank B is a space of BA[1]=0 and BA[0]=1, the bank C is a space of BA[1]=1 and BA[0]=0 and the bank D is a space of BA[1]=1 and BA[0]=1. The banks A to D have common row addresses RA[0] to RA[N]. Further, each of the memory spaces 101 to 104 is divided into four spaces 1 to 4 obtained by degenerating four banks. It should be noted here that a space n generically represents a space nA, a space nB, a space nC and a space nD (n=1, 2, 3 and 4).

Each of the spaces 1 to 4 is classified by high 2 bits of the row address. Specifically, when the row address (RA) is assumed to be N-bit, each space 1 to 4 is specified by the high 2 bits of RA[N] and RA[N−1] of the row address. The space 1 is a space with RA[N]=0 and RA[N−1]=0. The space 2 is a space with RA[N]=0 and RA[N−1]=1, while the space 3 is a space with RA[N]=1 and RA[N−1]=0. The space 4 is a space with RA[N]=1 and RA[N−1]=1. In the space, a wordline is specified by bits below the 3rd highest bit of the row address.

The spaces having the same row addresses are simultaneously refreshed in each bank A to D. Upon determining one row address (RA[0] to RA[N]), all memory cells connected to the wordline of the row address (RA[0] to RA[N]) are simultaneously refreshed in all banks A to D. Accordingly, when all memory cells connected to the wordline of one row address in the space 1A of the bank A are refreshed, refreshing is simultaneously carried out to all memory cells connected to the wordlines of the row address equal to the above-mentioned row address in the space 1B of the bank B, the space 1C of the bank C, and the space 1D of the bank D.

The semiconductor memory device receives a signal via its command terminal or address terminal from outside. The command/address detecting section 11 decodes the signal and controls the internal operation of the semiconductor memory device according to the command obtained as a result of the decode. The command received by the semiconductor memory device include a self-refresh start, read, write or the like. It should be noted that FIG. 1 only shows circuits relating to the self-refresh operation.

The internal register 15 stores information for every space 1 to 4 indicating whether each space requires the self-refresh or not. The internal register 15 is reset when the semiconductor memory device is turned on. The internal register 15 has registers corresponding to the respective spaces 1 to 4 for storing a value of "H (High)" with respect to the space that requires the refresh.

The refresh cycle generating circuit 19 generates a timing pulse showing a self-refresh cycle determining a timing for executing the self-refresh operation. The row address counter for self-refresh 17 receives the timing pulse from the self-refresh cycle generating circuit 19 and produces a row address designating an area to be self-refreshed at the timing.

The self-refresh enable signal generating circuit 21 receives the timing pulse from the self-refresh cycle generating circuit 19, and then, produces a pule signal for a refresh enable after a lapse of a predetermined delay time. When receiving the refresh enable pule signal, the memory 23 executes the refresh operation to the wordline at the address produced by the row address counter for self-refresh 17. The predetermined delay time in the self-refresh enable signal generating circuit 21 is set to at least a time required from when the row address counter for self-refresh 17 receives the timing pulse until when a count-up of the address is surely completed so that the memory 23 can not be refreshed before a new row address is produced.

The detail description is made to the operations of the refresh necessity judging section 13, self-refresh cycle generating circuit 19 and the row address counter for self-refresh 17 in the semiconductor memory device.

After resetting the internal register 15 upon power-on, the refresh necessity judging section 13 decides the need of self-refresh to each space by judging whether there is an access to the corresponding each space from the command decoded by the address/command detecting section 11. Specifically, the refresh necessity judging section 13 decides that, if no access is given to the space after the reset upon power-on, the refresh operation does not have to be executed to this space, while it decides that, if any access is given to the space, the refresh operation is required to be executed. For example, when an ACT command is input to the corresponding space or when the ACT command and WRITE command are input to the corresponding space, it is determined that any access is given to the corresponding space, and thus it can be judged that the self-refresh operation is required to be executed to this space. The internal register 15 holds the judging result of the refresh necessity judging section 13 with respect to each space.

Figure 2:
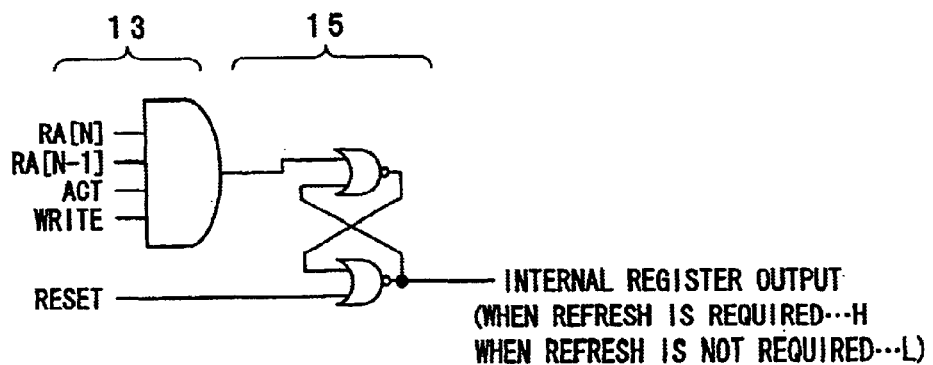
FIG. 2 is a view showing a partial configuration of a refresh necessity judging section and an internal register.

FIG. 2 is a view showing a configuration of the refresh necessity judging section 13 and the internal register 15 relating to the memory space having the high 2 bits of "11", i.e., the space 4. The internal register 15 is reset by a RESET signal generated upon power-on of the semiconductor memory device, resulting in the output of "L (Low)". Subsequently, when the ACT signal and WRITE signal are input to the space 4, the internal register 15 is set to output "H (High)".

Figure 3:
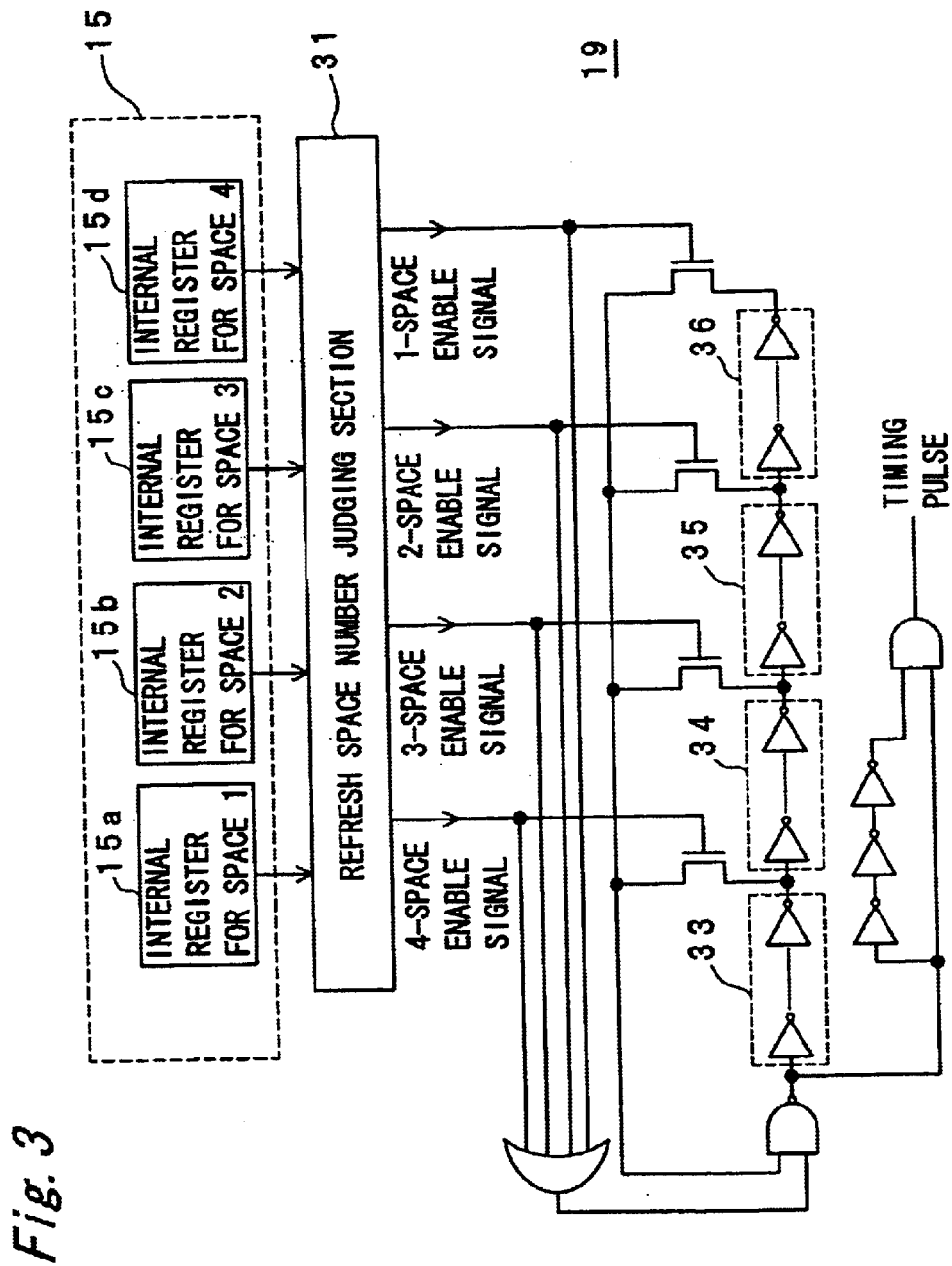
FIG. 3 is a constructional view of a self-refresh cycle generating circuit.

The self-refresh cycle generating circuit 19 generates the self-refresh cycle that is a execution timing of the self-refresh operation. The self-refresh cycle generating circuit 19 changes a cycle for generating a timing pulse that determines the self-refresh cycle, with reference to the internal register 15. FIG. 3 represents one example of a configuration of the self-refresh cycle generating circuit 19. The self-refresh cycle generating circuit 19 has a refresh space number judging section 31. The internal register 15 has, per space, registers 15a to 15d for storing information indicating whether the self-refresh operation is required or not. The refresh space number judging section 31 refers to the registers 15a to 15d in the internal register 15 to thereby determine the number of spaces requiring the refresh operation. Then, an enable signal according to the number of the spaces requiring the refresh operation is made active.

Inverter circuits 33 to 36 are selected according to the enable signal. Specifically, when there is one space requiring the refresh operation, the inverter circuits 33, 34, 35 and 36 are selected. In case that there are two spaces requiring the refresh operation, the inverter circuits 33, 34 and 35 are selected. In case that there are three spaces requiring the refresh operation, the inverter circuits 33 and 34 are selected. In case that there are four spaces requiring the refresh operation, the inverter circuit 33 is only selected. The cycle for generating the timing pulse is different according to the number of the selected inverter circuit.

When there are two spaces requiring the refresh operation, for example, a 2-space Enable signal is made active. This selects the inverter circuits 33, 34 and 35, so that the timing pulse is output at the refresh cycle at the time of refreshing two spaces.

The inverter circuits 33 to 36 include even-stage inverters. The delay time of each inverter is adjusted as follows. Specifically, assuming that the cycle for generating the timing pulse in case where only one space is required to be refreshed is 12P, the delay time of the inverter circuit 33 is adjusted to 3P, the delay time of the inverter circuit 34 is adjusted to 1P, the delay time of the inverter circuit 35 is adjusted to 2P and the delay time of the inverter circuit 36 is adjusted to 6P. This means that the cycle for generating the timing pulse is 6P in the case of refreshing two spaces, 4P in the case of refreshing three spaces, and 3P in the case of refreshing all of the four spaces. Thus, the cycle for refreshing the same space is always constant (12P) regardless of the number of the spaces to be refreshed.

Figure 4:
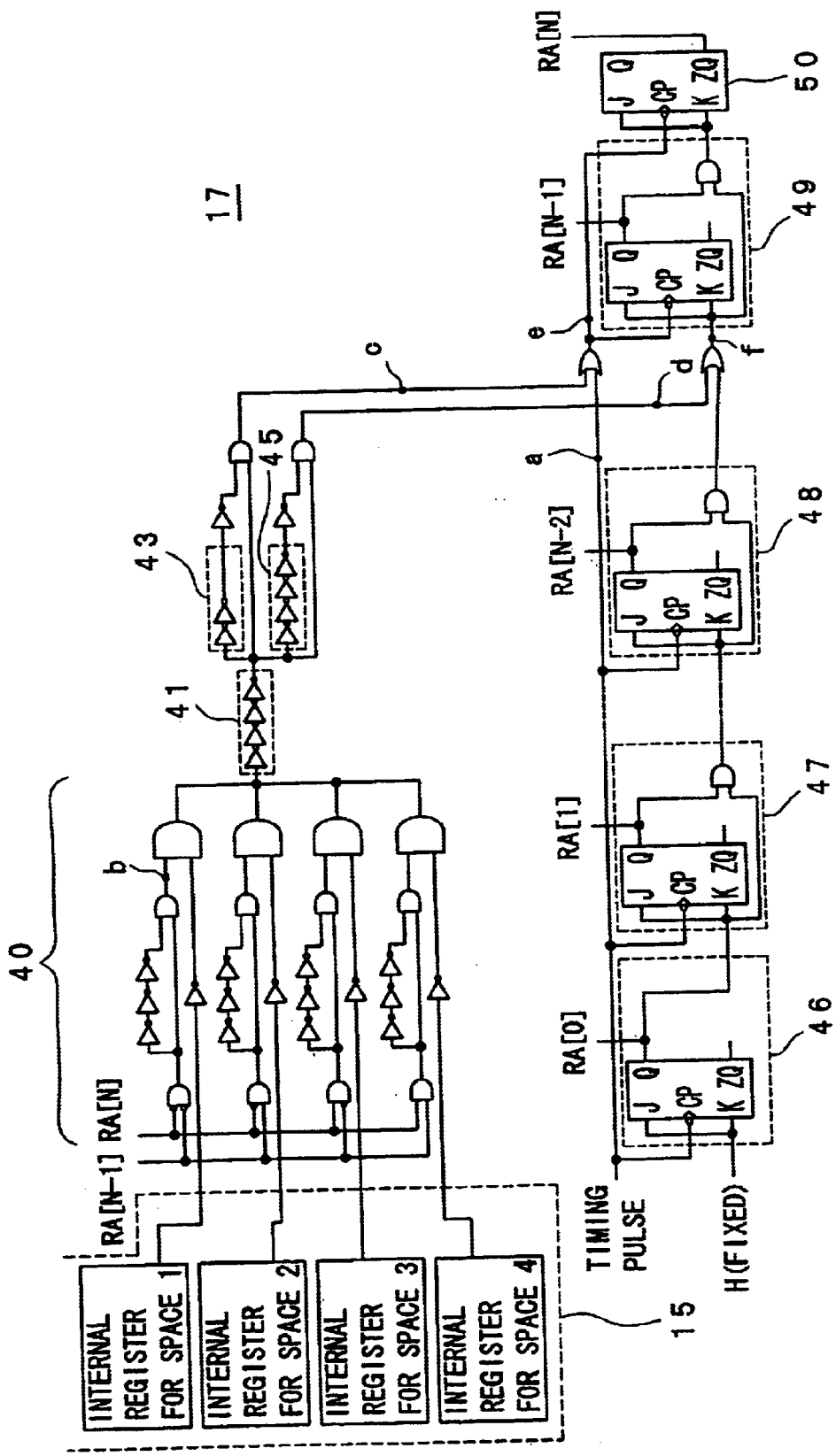
FIG. 4 is a view showing a configuration of a row address counter for self-refresh.

FIG. 4 is a view showing a configuration of the row address counter for self-refresh 17. The row address counter for self-refresh 17 refers to the internal register 15, and performs count-up while skipping the address requiring no refresh operation, thus to generate a row address for refresh.

The row address counter for self refresh 17 includes a circuit block 40 that judges whether the refresh operation is required or not and circuits 46 to 50 that perform the count-up of the row address.

The circuits 46 to 49 each includes a JK flip-flop and outputs the value of each bit of the row address. The circuits 46 to 50 as a whole count up the row address every input timing of the timing pulse.

The circuit block 40 inputs the high 2 bits RA[N] and RA[N-1] of the row address. In case where the value of the internal register of the space corresponding to this high 2 bits shows the needless of the refresh operation, the circuit block 40 outputs a one-shot pulse. This pulse is transmitted to the circuits 49 and 50 at the downstream side via delay circuits 41, 43 and 45.

The inverter circuit 41 adjusts the switch-over timing of the row address signal. The inverters 43 and 45 adjust the input timing of the J- and K-inputs of the JK flip-flop and the set-up and hold timings of the timing pulse, respectively.

The row address RA as a whole is counted up by the circuits 46 to 50 every input timing of the timing pulse from the self-refresh cycle generating circuit 19. At this time, the internal register 15 is referred to. When the space corresponding to the high-order 2 bits of the row address is judged that there is no need to perform the self-refresh operation thereto, the one-shot pulse is outputted from the circuit block 40, thereby only the high 2-bit addresses RA[N] and RA[N-1] are counted up. The row address of the space that is not needed to be self-refreshed is skipped by this count-up, resulting in that the high 2 bits of the row address designate the next space. It should be noted here that the judgement for the need of the self-refresh to the memory space, i.e., the generation of the one-shot pulse from the circuit block 40 is carried out at a cycle shorter than the cycle for generating the timing pulse output from the self-refresh cycle generating circuit 19.

Figure 5:
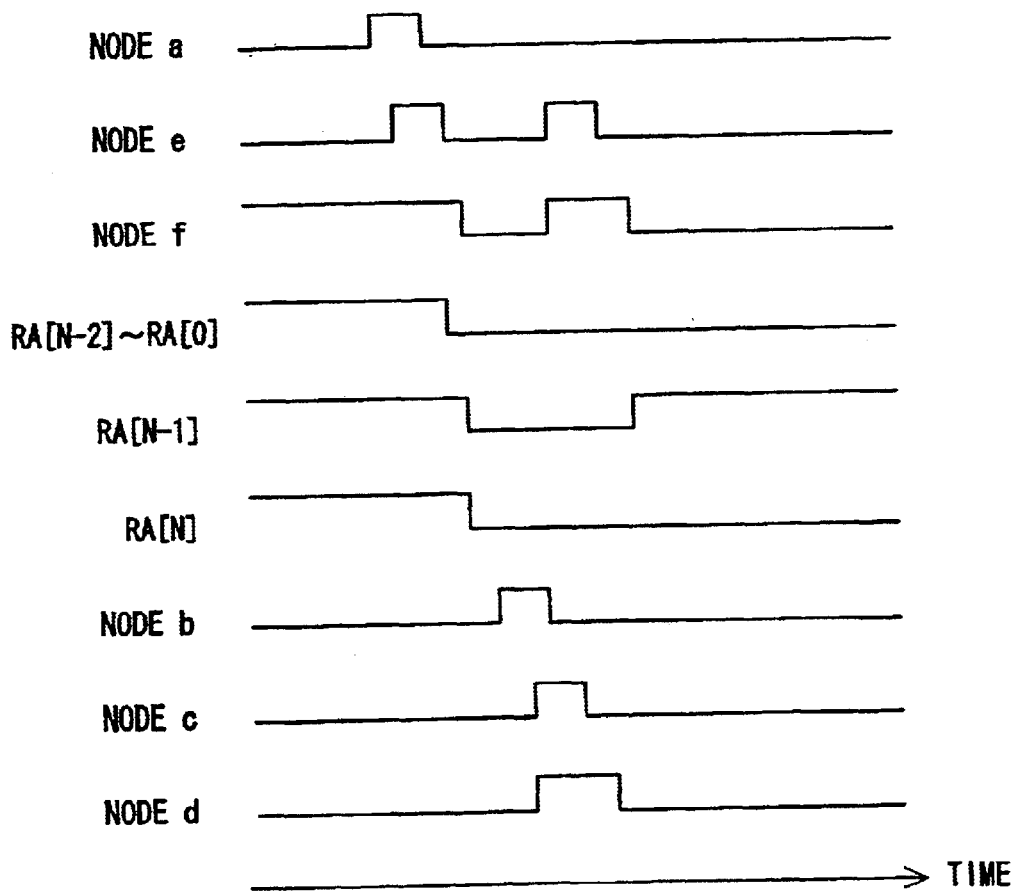
FIG. 5 is a view showing waveforms of nodes in the row address counter for self-refresh.

The above-mentioned operation will specifically be explained with reference to FIG. 5. It should be noted that FIG. 5 is a view showing waveforms of nodes on the row address counter for self-refresh 17. The following explanation is about the example of the operation when the row address (RA[0:N]) is counted up from "11 . . . 11" to "00 . . . 00". In the following explanation, the refresh operation is unnecessary to the spaces 1A to 1D (the high 2 bits RA[N] and RA[N-1] are "00"). In this case, the internal register 15a for the space 1 stores "L".

When the timing pulse from the self-refresh cycle generating circuit 19 falls at a node a, the output from the row address counter for self-refresh 17 is counted up from "11 . . . 11" (i.e., RA[0]~RA[N-2]=1, RA[N-1]=1, RA[N]=1) to "00 . . . 00" (i.e., RA[0]~RA[N-2]=0, RA[N-1]=0, RA[N]=0). Since RA[N-1]=0 and RA[N]=0 at this time, the circuit block 40 generates the one-shot pulse at a node b. The output from the internal register 15a for the space 1 becomes "L", and therefore the one-shot pulse at the node b is transmitted to nodes c and d at the downstream stage.

The one-shot pulse at the node b is transmitted to the nodes c and d after delayed for a predetermined time by the inverter circuits 41, 43 and 45. By this, OR operation result of the timing pulse from the self-refresh cycle generating circuit 19 and the pulse generated at the circuit block 40 is transmitted to nodes e and f, thereby the circuits 49 and 50 are triggered to count up only the high 2 bits RA[N-1] and RA[N]. In the example of FIG. 5, RA[N-1] becomes 1 and RA[N] becomes 0, while RA[0]~RA[N-2] remain 0.

As described above, the row address counter for self-refresh 17 refers to the internal register 15 storing the information about the need of the refresh, does not generate the address with respect to the spaces 1A to 1D requiring no refresh, and generates the address with respect to the next spaces 2A to 2D (RA[N-1]=1, RA[N]=0).

If the refresh is also not required to the memory spaces 2A to 2D (RA[N-1]=1, RA[N]=0), a register 15b for the space 2 is referred to according to the similar sequence. The one-shot timing pulse is generated at the nodes e and f, thereby counting up RA[N-1] and RA[N], so that RA[N-1] becomes 0 and RA[N] becomes 1.

As described above, the row address counter for self-refresh 17 generates an address with the address for spaces requiring no refresh skipped at a cycle shorter than the cycle for generating the timing pulse output from the self-refresh cycle generating circuit 19. This can eliminate the unnecessary refresh operation, thereby resulting in reduction of the unnecessary refresh current (Icc6).

Further, the row address counter for self-refresh 17 refers to the internal register 15 storing the information about the need of the refresh so as not to generate an address to the space requiring no refresh. This can prolong the cycle for generating the timing pulse from the self-refresh cycle generating circuit 19, thereby resulting in reduction of the refresh current (Icc6).

In the Reference 1, the internal register stores only the information about the start and end addresses with respect to the space requiring no refresh, and therefore it entails a problem that, in case where the addresses for the spaces requiring no refresh are discontinuous, the current reduction effect is small. On the contrary, the present invention can reduce the refresh current even if the addresses are discontinuous, as long as the refresh is performed in divided memory space unit. In other words, the present invention has an effect of further reducing the refresh current during the random access.

Second Embodiment

Figure 6:
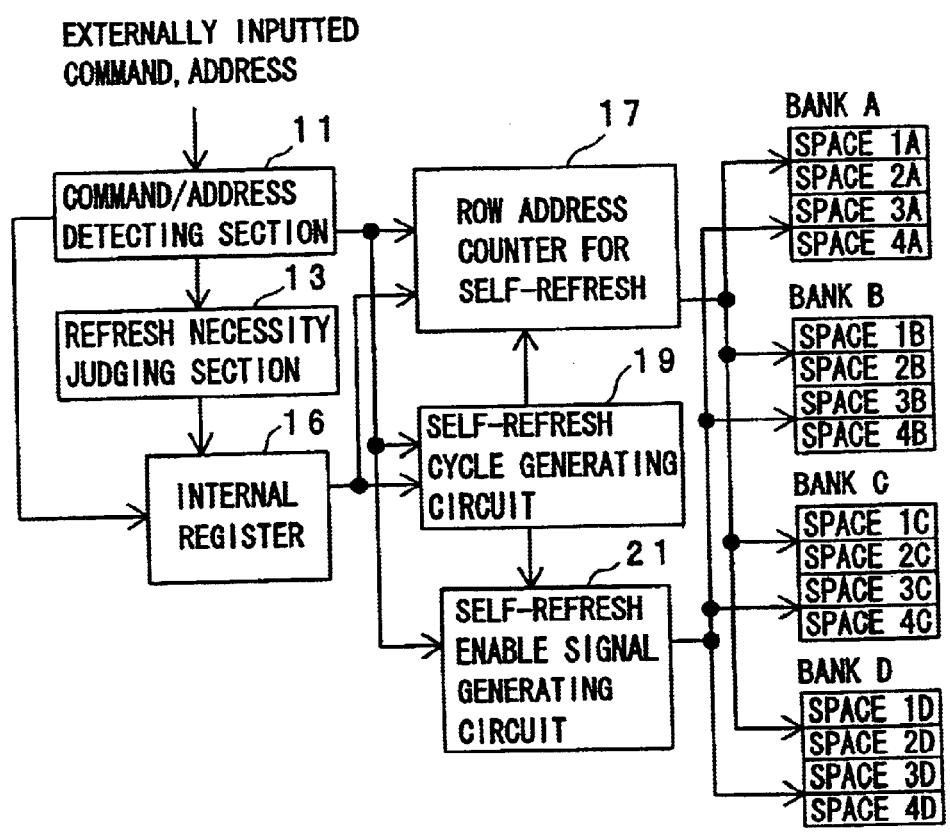
FIG. 6 is another view showing a configuration of a semiconductor memory device according to the present invention (Second Embodiment).

FIG. 6 shows a configuration of a semiconductor memory device of this embodiment. The configuration and operation of the semiconductor memory device of this embodiment are basically the same as those in the first embodiment, except that the internal register 16 in this embodiment can be reset by an external command. Specifically, the internal register 15 storing the information about the need of the refresh is reset only upon the power-on in the first embodiment, while the internal register 16 storing the information about the need of the refresh can be reset at a desired timing by the external command in this embodiment.

A command (hereinafter referred to as "reset command") for resetting the internal register 16 is provided in advance. The command/address detecting section 11 sends a control signal for resetting the internal register 16 to the internal register 16 when detecting the reset command. Upon receiving the control signal, the internal register 16 is reset. It is to be noted that the internal register 16 may be reset as a whole or may be reset every memory space.

In the case of a normal DRAM, the internal register is set with an MRS (mode register set) sequence. Therefore, the above-mentioned reset function of the internal register 16 by the input of the external command can easily be realized by utilizing a free address in the MRS sequence.

In the first embodiment, when at least one access is made to each space, the internal register is not reset so long as the power is turned off even if the refresh operation of the data becomes unnecessary after that. Accordingly, the refresh happens to be made to the space requiring no refresh operation, entailing a problem of lowering the reduction effect of the refresh current (Icc6). On the contrary, the internal register 16 can be reset by the external command in this embodiment, so that the internal register 16 can be reset at any time without turning off the power source. Therefore, the refresh is made only to the space requiring the refresh operation, thereby being capable of further enhancing the reduction efficiency of the refresh current (Icc6) compared to the the first embodiment.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in Japanese Patent Application No. 2003-47167, filed on Feb. 25, 2003, which is expressly incorporated herein by reference in its entirety.

What is claimed is:

1. A semiconductor memory device comprising:

a memory that requires a refresh operation and has a predetermined number of divided memory spaces;

an internal register that stores information indicating whether the refresh operation is required or not with respect to each memory space;

an address counter coupled to the register, counts up an address while skipping an address for the memory space requiring no refresh operation to generate an address of the memory space to be refreshed; and a cycle generating circuit coupled to the register, generates a refresh cycle which varies according to the number of the memory spaces requiring the refresh operation.

2. The semiconductor memory device according to claim 1, wherein the internal register can be reset from the outside.

3. The semiconductor memory device according to claim 1, wherein the cycle generating circuit varies the refresh cycle so as to keep a cycle for refreshing the same memory space constant regardless of the number of the memory spaces requiring the refresh operation.

* * * * *